United States Patent
Wong et al.

(10) Patent No.: US 10,304,735 B2
(45) Date of Patent: May 28, 2019

(54) MECHANICALLY STABLE COBALT CONTACTS

(71) Applicant: GLOBALFOUNDRIES INC., Grand Cayman (KY)

(72) Inventors: Keith Kwong Hon Wong, Wappingers Falls, NY (US); Wonwoo Kim, Malta, NY (US); Praneet Adusumilli, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/630,002

(22) Filed: Jun. 22, 2017

(65) Prior Publication Data
US 2018/0374749 A1    Dec. 27, 2018

(51) Int. Cl.
| H01L 23/532 | (2006.01) |
| H01L 21/768 | (2006.01) |
| H01L 23/535 | (2006.01) |
| H01L 23/485 | (2006.01) |

(52) U.S. Cl.
CPC .. *H01L 21/76889* (2013.01); *H01L 21/76805* (2013.01); *H01L 21/76895* (2013.01); *H01L 23/485* (2013.01); *H01L 23/535* (2013.01); *H01L 23/53209* (2013.01)

(58) Field of Classification Search
CPC ............. H01L 21/76889; H01L 23/535; H01L 23/53209; H01L 21/76805; H01L 21/76895; H01L 23/768; H01L 23/532
USPC ....................................................... 257/757
See application file for complete search history.

(56) References Cited

U.S. PATENT DOCUMENTS

| 7,696,586 | B2 | 4/2010 | Agnello et al. |
| 9,287,170 | B2 | 3/2016 | Lee et al. |
| 9,472,502 | B1 | 10/2016 | Lee et al. |
| 9,576,908 | B1* | 2/2017 | Lin ........................ H01L 23/535 |
| 9,620,512 | B1* | 4/2017 | Nishikawa ........ H01L 27/11524 |
| 9,735,050 | B2* | 8/2017 | Lin .................... H01L 21/76847 |
| 9,876,031 | B1* | 1/2018 | Shimizu ............... H05K 999/99 |
| 2004/0108217 | A1* | 6/2004 | Dubin ..................... C23C 18/48 |
| | | | 205/291 |
| 2005/0032365 | A1 | 2/2005 | Marsh |
| 2010/0078817 | A1* | 4/2010 | Koerner ............ H01L 21/28512 |
| | | | 257/751 |
| 2010/0117237 | A1 | 5/2010 | Coolbaugh et al. |
| 2011/0156107 | A1 | 6/2011 | Bohr et al. |
| 2012/0139015 | A1* | 6/2012 | Yu ...................... H01L 21/28518 |
| | | | 257/288 |
| 2014/0183738 | A1 | 7/2014 | Jezewski et al. |

(Continued)

OTHER PUBLICATIONS

Hosseini, Marysamsadat, et al, "Amorphous Co—Ti alloy as a Single Layer Barrier for Co Local Interconnect Structure"; Department of Materials Science, Tohoku University, Sendai 980-8579, Japan, IEDM 2016.

*Primary Examiner* — Alexander O Williams
(74) *Attorney, Agent, or Firm* — David Cain; Hoffman Warnick LLC (57) ABSTRACT

A cobalt contact includes a dual silicide barrier layer. The barrier layer, which may be formed in situ, includes silicides of titanium and cobalt, and provides an effective adhesion layer between the cobalt contact and a conductive device region such as the source/drain junction of a semiconductor device, eliminating void formation during a metal anneal.

10 Claims, 6 Drawing Sheets

(56) References Cited

U.S. PATENT DOCUMENTS

| | | | |
|---|---|---|---|
| 2015/0179512 A1* | 6/2015 | Lai | H01L 21/76877 257/754 |
| 2015/0179662 A1* | 6/2015 | Makala | H01L 27/11582 257/314 |
| 2015/0187781 A1* | 7/2015 | Hong | H01L 27/11521 257/316 |
| 2016/0049362 A1* | 2/2016 | Lin | H01L 23/528 257/751 |
| 2017/0110479 A1* | 4/2017 | Chen | H01L 27/0255 |
| 2017/0125436 A1* | 5/2017 | Sharangpani | H01L 27/11582 |
| 2017/0148811 A1* | 5/2017 | Zhang | H01L 27/11582 |
| 2017/0317193 A1* | 11/2017 | Peng | H01L 29/41791 |
| 2017/0358531 A1* | 12/2017 | Lin | H01L 23/53266 |
| 2017/0373078 A1* | 12/2017 | Chu | H01L 21/76802 |
| 2017/0373087 A1* | 12/2017 | Ito | H01L 27/11582 |
| 2018/0122906 A1* | 5/2018 | Yu | H01L 27/11524 |
| 2018/0151497 A1* | 5/2018 | Makala | H01L 23/535 |

\* cited by examiner

MECHANICALLY STABLE COBALT CONTACTS

BACKGROUND

The present application relates generally to conductive interconnect structures, and more specifically to cobalt-based interconnect structures and barrier layer architectures that improve the mechanical integrity of such structures.

Electrically-conductive connections between integrated circuit (IC) devices formed on a semiconductor substrate are traditionally made using multi-layer interconnects. Each interconnect layer can be supported over the substrate by an interlayer dielectric. Furthermore, electrical connections to and between different conductive layers are commonly made using contacts in the form of plugs that traverse one or more layers of the interlayer dielectric.

Typical interconnect structures comprise copper (Cu) or tungsten (W). Copper is advantageous because of its low electrical resistivity. However, copper is susceptible to electromigration and void formation, which can lead to device failure, while the precursors used during tungsten CVD processes are highly reactive with silicon and associated liner materials. Thus, tungsten is particularly sensitive to defects (e.g., pin-hole defects) in the barrier layer architecture used to isolate the tungsten interconnects from the liner metal and silicon.

In addition, tungsten resistivity cannot be decreased with post-deposition annealing as it is a refractory metal and does not undergo recrystallization or grain growth at thermal budgets that are compatible with semiconductor manufacturing. Moreover, it has been observed that the barrier and nucleation layer thicknesses for tungsten-based metallization are not scaling to meet resistance requirements at advanced nodes.

An alternative interconnect material to copper and tungsten is cobalt. Due to a higher activation energy, cobalt is less prone to electromigration compared to copper, and is compatible with thin barrier layer architectures, which can be especially advantageous at advanced nodes, e.g., less than 14 nm. Processing subsequent to the formation of cobalt contacts, however, including annealing to induce reflow and recrystallization, can introduce stresses that compromise the mechanical integrity of cobalt contacts, including failed adhesion to underlying barrier layers. Delamination and void formation can undesirably increase contact resistance or cause device failure.

SUMMARY

In accordance with embodiments of the present application, a metal interconnect structure includes a dielectric layer disposed over a semiconductor substrate and an opening in the dielectric layer, wherein the opening has sidewalls and exposes a conductive region of the substrate. A barrier layer architecture is disposed over the conductive region, the barrier layer architecture including a titanium silicide layer disposed over the conductive region and a cobalt silicide layer disposed over the titanium silicide layer. A cobalt-containing fill layer is disposed within the opening and on a surface of the barrier layer architecture.

A method of forming a metal interconnect structure includes forming an opening in a dielectric layer disposed over a semiconductor substrate, where the opening exposes a conductive region of the substrate. A titanium layer is then formed within the opening and over the conductive region of the substrate. A silicon layer is formed over the titanium layer, and a cobalt layer is formed over the silicon layer.

The method further includes reacting the titanium layer with the conductive region to form a titanium silicide layer and reacting the cobalt layer with the silicon layer to form a cobalt silicide layer. A fill layer comprising cobalt is formed within the opening and on a surface of the cobalt silicide layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Figure 1:
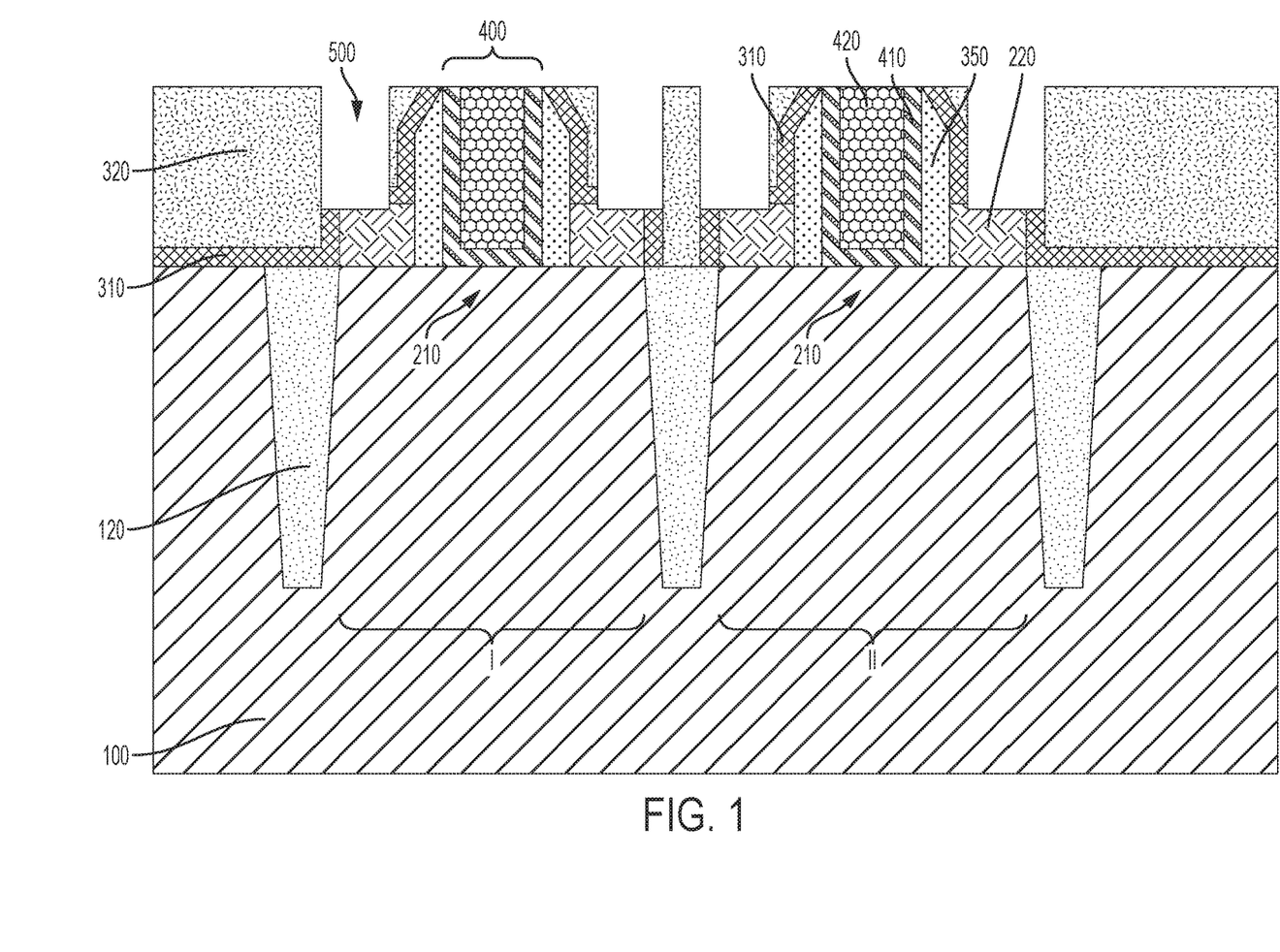
FIG. 1 is a schematic cross-sectional diagram of a semiconductor device at an intermediate stage of manufacture after a replacement metal gate module and following the formation of contact openings to expose source/drain regions of the device.

Referring to FIG. 1, a semiconductor structure at an intermediate stage of fabrication includes active device regions disposed over a semiconductor substrate 100. The semiconductor substrate 100 may comprise a bulk semiconductor substrate or a hybrid substrate such as a semiconductor-on-insulator (SOI) substrate. The device may comprise a planar (two-dimensional) device, or a three-dimensional device such as a fin field effect transistor (FinFET), as will be appreciated by those skilled in the art.

In the illustrated embodiment, first and second device regions I, II are separated by shallow trench isolation (STI) layers 120 and may be respectively configured to form, for example, an n-type field effect transistor (n-FET) and a p-type field effect transistor (p-FET).

A replacement metal gate (RMG) architecture 400, including one or more gate dielectric layers 410 and one or more gate conductor layers 420, is defined between sidewall spacers 350 and overlying a respective channel region 210 of each device. As known to those skilled in the art, source/drain junctions 220 are located on opposing sides of the channel region 210.

Source/drain junctions 220 may be formed by ion implantation or selective epitaxy prior to depositing a conformal liner 310 and an interlayer dielectric 320, optionally using the sidewall spacers 350 as an alignment mask. According to various embodiments, source/drain junctions 220 are formed by selective epitaxy into self-aligned cavities that are defined between sacrificial gate stacks (not shown). Source/drain junctions 220 may comprise silicon (e.g., Si) or a silicon-containing material such as silicon germanium (SiGe). For instance, SiGe source/drain junctions may be incorporated into a p-MOS device to provide compressive stress to the channel, which can improve carrier mobility.

The conformal liner 310 and dielectric layer 320 are formed over the substrate 100, and over the active device regions, including the source, drain and gate. Conformal liner 310 may comprise a nitride layer such as silicon nitride. Dielectric layer 320 may comprise any suitable insulating or dielectric material including oxides, nitrides and oxynitrides, such as silicon dioxide, silicon nitride, silicon oxynitride, SiOC, SiOCN and SiBCN, as well as other low dielectric constant (low-k) materials.

As used herein, the compounds silicon nitride and silicon dioxide have compositions that are nominally represented as $Si_3N_4$ and $SiO_2$, respectively. However, the terms silicon nitride and silicon dioxide, refer to not only these stoichiometric compositions, but also to nitride and oxide compositions that deviate from the stoichiometric compositions.

Exemplary low-k materials include, but are not limited to, amorphous carbon, fluorine-doped oxides, and carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™. A "low-k" material has a dielectric constant less than that of silicon dioxide.

Although only a single dielectric layer 320 is shown, it will be appreciated that dielectric layer 320 may comprise multiple dielectric layers of the same or different composition.

An opening 500 is formed in the dielectric layer 320, extending through conformal liner 310, to expose source/drain junction 220. Opening 500 may comprise a trench or a via and may be formed using patterning and etching processes known to those skilled in the art. The patterning process may comprise photolithography, for example, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the underlying dielectric layer(s) utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used. In the illustrated embodiment, one or more etching steps can be used to etch dielectric layer 320 and conformal liner 310 and expose source/drain junction 220.

A separate oxide etch may be used to remove native oxide or other oxide layer(s) from over the source/drain junctions 220 within the openings 500. In certain embodiments, such an oxide layer (not shown) may be removed by a selective etch process such as a wet chemical etch process (e.g., using dilute hydrofluoric acid) or a dry etch process. For instance, the oxide etch may be selective to silicon and silicon nitride. In the case of a dry etch process, the etch may be performed in situ, i.e., such that the substrate may be transferred directly to a subsequent metal deposition process without a break in vacuum.

Figure 2:
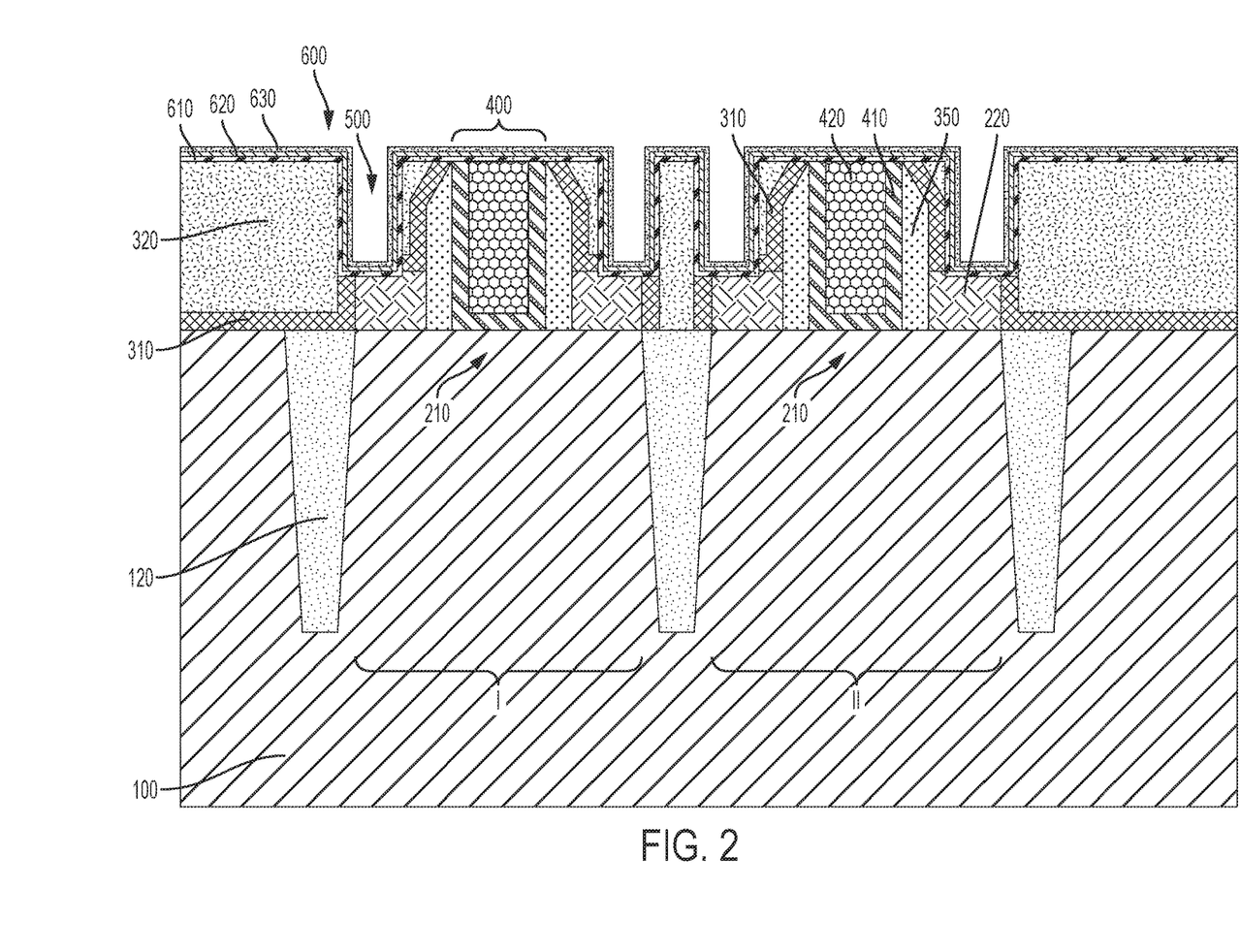
FIG. 2 shows the successive formation of conformal layers of titanium, silicon and cobalt within the contact openings prior to metallization of the contact openings according to various embodiments.

Prior to filling the opening 500 with a metal or other conductive material to form a conductive contact, a barrier layer architecture 600 is formed within opening 500 and over the source/drain junction 220. According to various embodiments, the barrier layer 600 may comprise, prior to a silicidation anneal, a layer of titanium 610, a layer of silicon 620, and a layer of cobalt 630. During or subsequent to the formation of the barrier layer architecture 600, the structure may be annealed to form a low resistance, dual silicide layer including a titanium silicide layer and a cobalt silicide layer between the source/drain junction 220 and a later-formed conductive fill layer. The dual silicide layer is adapted to function as an anchoring layer between the conductive fill layer and the bottom of the opening, decreasing the tendency of void formation during a subsequent anneal.

The barrier layer architecture 600 may be deposited by any thin film deposition technique available in the industry including, but not limited to, physical vapor deposition (e.g., sputter deposition or evaporation), chemical vapor deposition, or atomic layer deposition, for example.

Referring to FIG. 2, in various embodiments, the barrier layer architecture 600 includes a layer of titanium (Ti) 610 formed within opening 500 and directly over exposed surfaces of the dielectric layer(s) and source/drain junction 220, a layer of silicon 620 formed directly over the titanium layer 610, and a layer of cobalt 630 formed directly over the layer of silicon 620. In some methods, the barrier layer architecture 600 may be formed also over a top surface of dielectric layer 320, and later removed therefrom using a planarization technique as known to those skilled in the art.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

According to various embodiments, a thickness of the layers 610, 620, 630 that form the barrier layer architecture 600 may independently range from 2 nm to 20 nm, e.g., 2, 4, 6, 8, 10, 12, 15 or 20 nm, including ranges between any of the foregoing values.

During or subsequent to the formation of any one of the layers 610, 620, 630, an annealing step may be used to form a silicide layer in situ. Such annealing can be performed at a temperature of 200° C. to 450° C., e.g., 300° C. The annealing step(s) may be carried out using a conventional oven or using rapid thermal annealing (RTA) for a period of time ranging from 5 seconds to 10 min, for example, e.g., 10 to 60 seconds.

Silicidation annealing can be carried out in an inert atmosphere. In certain embodiments, the annealing is performed in an oxygen-free or substantially oxygen-free atmosphere. As used herein, "substantially oxygen-free" means less than 100 ppm oxygen, such as 5, 10, 20 or 50 ppm oxygen, including ranges between any of the foregoing values.

In an example embodiment, a conformal (CVD or ALD) layer of titanium (Ti) is formed within opening 500 and directly over source/drain junction 220. During deposition of the titanium layer 610 or during a subsequent annealing step, a portion (e.g., 10-99%) of the titanium layer 610 reacts with the source/drain junction 220 to form a thin, well-adhered titanium silicide layer 605 directly over the source/drain junction 220. The titanium silicide layer 605 may be amorphous, crystalline or a mixture of amorphous and crystalline phases.

In certain embodiments, a majority of the titanium layer 610 overlying the source/drain junction 220 is converted to titanium silicide. For instance, 55-99% of the titanium layer 610 may be reacted to form titanium silicide layer 605. In such embodiments 60, 70, 80, 90, 95 or 99% of the titanium layer 610, including ranges between any of the foregoing values, is reacted to form titanium silicide.

Referring still to FIG. 2, a silicon layer 620 is formed directly over conformal titanium layer 610, i.e., directly over unreacted portions of titanium layer 610. The silicon layer 620 can comprise elemental silicon (Si) or silicon alloys, including silicon doped with one or more dopants, i.e., impurities. Example dopants that may be incorporated into the silicon layer 620 include boron, carbon, nitrogen, aluminum, phosphorus, gallium, arsenic, indium and antimony. The dopant content within the silicon layer 620 may range from 0 to 5 atomic percent, i.e., 0, 1, 2, 3, 4 or 5 atomic percent, including ranges between any of the foregoing values.

Various methods can be used to form silicon layer 620, including physical vapor deposition (PVD), plasma doping, and gas cluster ion beam (GCIB) technology, although other deposition methods such as chemical vapor deposition (CVD) are contemplated. According to certain embodiments, the deposition temperature (i.e., substrate temperature) during formation of silicon layer 620 is less than 300° C., e.g., 25, 50, 100, 150, 200, 250 or 275° C., including ranges between any of the foregoing values. The as-deposited silicon layer 620 may be crystalline, e.g., polycrystalline, amorphous, or a mixture of crystalline and amorphous materials.

During deposition of the silicon layer 620 or during a subsequent annealing step, a portion of the silicon layer 620 can react with the titanium layer 610 to form a thin, well-adhered titanium silicide layer 615. The annealing step used to form titanium silicide layer 615 may be performed before or after deposition of a cobalt seed layer. Thus, the titanium silicide layer 615 forms a bridging adhesion layer between the titanium silicide layer 605 and a later-deposited cobalt layer.

A cobalt seed layer 630 is deposited over the silicon layer 620, e.g., directly over unreacted portions of silicon layer 620. Cobalt seed layer 630 may be formed using chemical vapor deposition (CVD), physical vapor deposition (PVD), atomic layer deposition (ALD), or other suitable process for creating a thin film. Cobalt seed layer 630 may comprise cobalt and, as will be appreciated by those skilled in the art, may be adapted to serve as a nucleation layer for the deposition of a fill material used to fill opening 500. A cobalt seed layer 630 need not be contiguous or completely cover the underlying silicon layer 620. Therefore, the cobalt seed layer 630 can be deposited by conventional physical vapor deposition. In such a case, cobalt deposition may be accomplished by sputtering a pure cobalt metal target. For example, sputtering may be carried out at an RF power of about 0.5 kW to 5 kW for about 5 to 30 seconds.

According to various embodiments, an annealing step may be used to react at least a portion of the cobalt seed layer 630 with the underlying silicon layer 620 to form a well-adhered cobalt silicide layer 635. The annealing step used to form cobalt silicide layer 635 may be performed prior to depositing a fill layer over the barrier layer architecture 600 to fill opening 500. The cobalt silicide layer 635 may be amorphous, crystalline or a mixture of amorphous and crystalline phases. In certain embodiments, cobalt silicide layer 635 is contiguous with titanium silicide layer 615 and cooperates with the titanium nitride layer to form a dual silicide adhesion layer.

Figure 3:
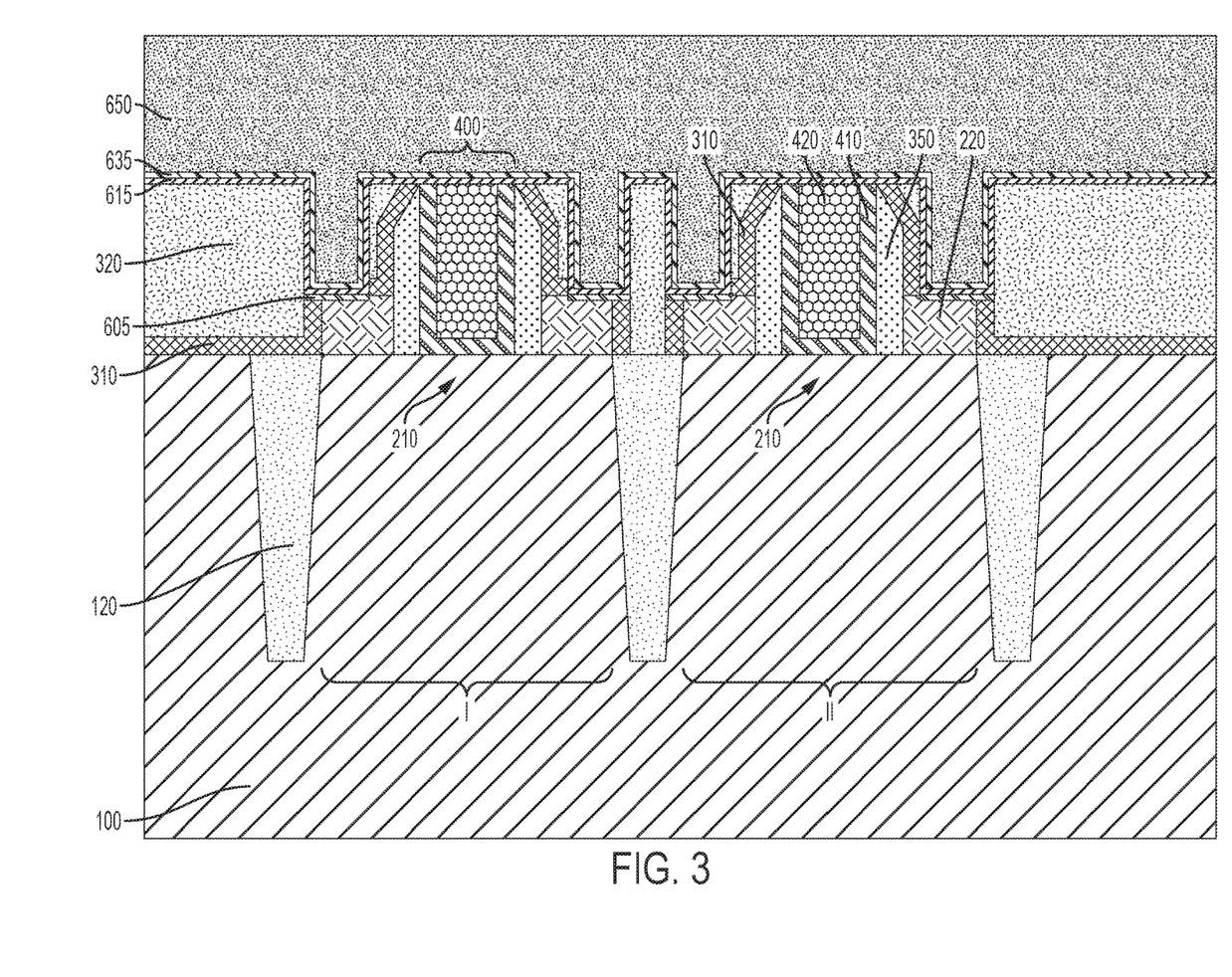
FIG. 3 depicts the in situ formation of titanium silicide and cobalt silicide layers within the contact openings and the metallization of the contact openings with a cobalt fill layer.

Referring to FIG. 3, a fill layer 650 may be deposited on exposed surfaces of the seed layer 630 to form a cobalt contact that substantially fills opening 500. In certain embodiments, fill material 650 overfills opening 500. The fill layer 650 may be deposited by CVD, PVD, ALD, electroplating, or electroless plating, for example.

The fill layer 650 may comprise elemental cobalt metal (Co) or a cobalt alloy. In certain embodiments, the fill layer 650 and the seed layer 630 have the same composition. In alternate embodiments, the fill layer 650 and the seed layer 630 have different compositions. By way of example, the composition of the seed layer 630 and the composition of fill layer 650 may be independently chosen from elemental cobalt (Co) and cobalt alloyed with up to 50 atomic percent of one or more of B, C, N, Mg, Al, Si, P, Ti, V, Cr, Mn, Fe, Ni, Cu, Zn, Ge, Zr, Nb, Mo, Ru, Rh, Pd, Ag, Hf, Ta, W, Re, Ir, Pt and Au.

Figure 4:
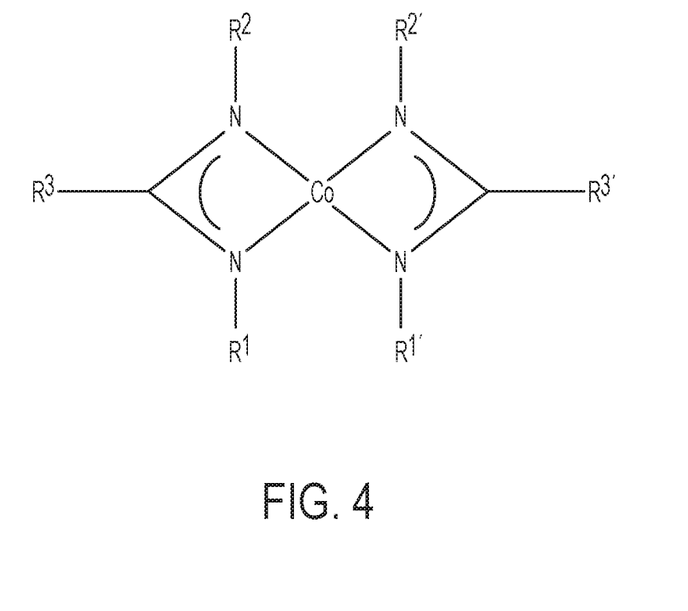
FIG. 4 shows an example precursor for the deposition of cobalt according to various embodiments.

In some embodiments, the fill layer 650 may be formed using chemical vapor deposition by exposing the substrate to a cobalt-containing precursor. Example cobalt-containing precursors include dicarbonyl cyclopentadienyl cobalt, cobalt carbonyl, various cobalt amidinate precursors, cobalt diazadienyl complexes, cobalt amidinate/guanidinate precursors, and combinations thereof. An example cobalt amidinate precursor is shown schematically in FIG. 4, where R1, R2, R3, R1', R2' and R3' may be chosen independently from hydrogen, alkyl, aryl, alkenyl, alkynyl, trialkylsilyl or fluoroalkyl groups.

In an exemplary CVD method for forming a cobalt-containing fill layer 650, a cobalt-containing precursor may be introduced into a reaction chamber using a carrier gas such as Ar, $N_2$ or CO at a flow rate of 10 to 500 sccm. The deposition temperature may range from 100° C. to 500° C., and the deposition pressure may range from 0.1 Torr to 50 Torr.

In further embodiments, the cobalt seed layer 630 and the fill layer 650 may be deposited using the same process (e.g., CVD, PVD, ALD) but with different deposition parameters, such as pressure, deposition rate, temperature, etc. For example, the seed layer 630 and the fill layer 650 may each be deposited by a CVD process, whereas the set of deposition parameters used in the CVD process for the seed layer, such as deposition temperature and pressure, may be different than the deposition parameters used in the CVD process for the fill layer.

In another example, the seed layer 630 and the fill layer 650 may each be formed by a PVD process, but the seed layer 630 may be formed by a PVD process with a greater distance between the target and the substrate than the PVD process used to form the fill layer 650. According to a further embodiment, the seed layer 630 may be formed using a non-collimated PVD process while the fill layer 650 may be formed using a collimated PVD process.

The cobalt metal fill layer 650 may be derived using a low oxygen content process, i.e., from a low oxygen content precursor, to form a layer that is substantially oxygen-free. As used herein, "substantially oxygen-free" refers to an amount of oxygen present within a layer that is 1 atomic percent or less, e.g., 1, 0.5, 0.1 or 0.05 at. %, including ranges between any of the foregoing values.

Various embodiments include reflowing the cobalt metal fill layer 650 by heating the cobalt layer to 200 to 600° C., which can improve step coverage. Such an anneal may also induce grain growth within the fill layer, which decreases resistivity. A reflow/recrystallization anneal may be performed in a reducing atmosphere, e.g., using hydrogen, nitrogen, argon or forming gas.

Figure 5:
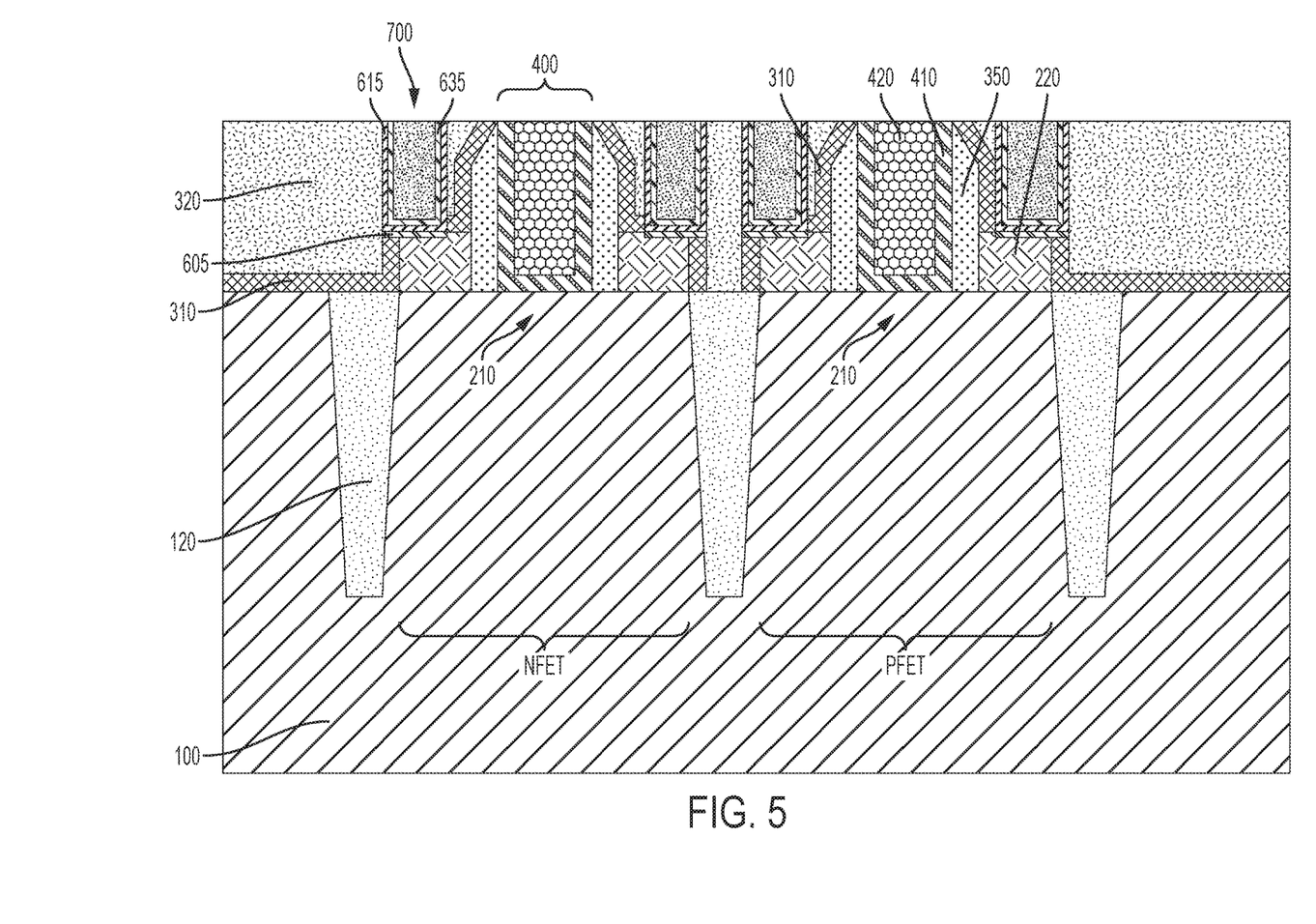
FIG. 5 shows a planarized structure after polishing the cobalt fill layer.

Illustrated in FIG. 5 is an intermediate, post-planarization architecture comprising a cobalt contact 700 disposed within dielectric layer 320 and in electrical contact with source/drain junction 220. Cobalt contact 700 includes silicide layers 605, 615, 635 and fill layer 650. As will be appreciated by those skilled in the art, a planarization process can be used to remove the overburden, i.e., portions of the barrier layer architecture 600 and fill layer 650 deposited outside of opening 500, i.e., over a top surface of the dielectric layer 320, to form a global planarized surface. A top surface of dielectric layer 320 may serve as a CMP stop layer. In certain embodiments, a surface of the cobalt contact 700 is substantially co-planar with a surface of the dielectric layer 320. In certain embodiments, a surface of the cobalt contact 700 is recessed below a surface of the dielectric layer 320.

Figure 6:
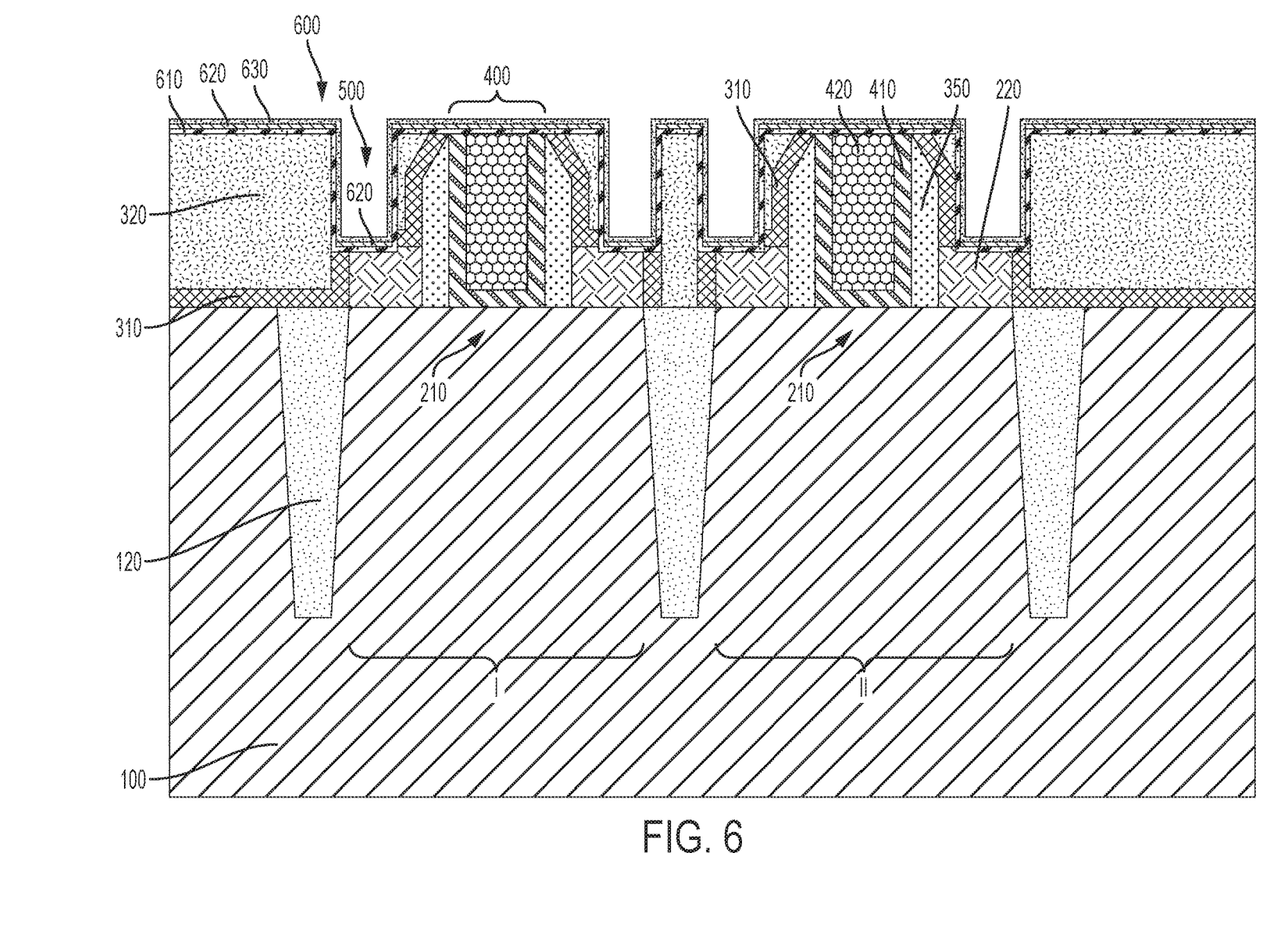
FIG. 6 shows the formation of conformal layers of titanium and cobalt, and a non-conformal layer of silicon within the contact openings prior to metallization according to further embodiments.

An alternate embodiment for forming a dual silicide adhesion layer is illustrated schematically in FIG. 6. In lieu of a conformal silicon layer as shown schematically in FIG. 2, a line-of-sight, e.g., physical vapor deposition (PVD) method, may be used to form silicon layer 620. Such a method includes selecting a target material comprising silicon, introducing a sputtering gas to a reaction chamber comprising the semiconductor substrate and the target material, and forming a plasma in an atmosphere of the sputtering gas to sputter atoms from the target material to the semiconductor substrate to form a silicon layer 620 directly over horizontal surfaces of the titanium layer 610. The sputtering gas can comprise one or more of helium, nitrogen and argon.

In the illustrated embodiment of FIG. 6, deposition of the silicon layer 620 is restricted to the bottom of the opening 500 whereby a larger cross-sectional area of the opening is available for metallization. Cobalt seed layer 630 is thereafter deposited directly over exposed portions of silicon layer 620 as well as directly over titanium layer 610 along sidewalls of opening 500. Subsequent to the formation of cobalt seed layer 630, an annealing step may be used to promote reaction of cobalt with silicon to form a silicide of cobalt at the bottom of opening 500, i.e., over source/drain junction 220.

The methods and structures of the present application provide a self-aligned dual silicide layer within a cobalt contact. The dual silicide layer includes at least one titanium silicide sub-layer 605, 615 and a cobalt silicide sub-layer 635 that cooperate to provide an effective adhesion/barrier/conduction layer between source/drain junctions 220 and contact metallization 700. According to certain embodiments, titanium nitride (TiN), which is commonly used as a barrier layer in conductive contacts, is eliminated from the barrier layer architecture 600 in favor of lower resistivity silicide layers.

Although certain embodiments may be adapted for fabricating semiconductor integrated circuits such as, but not limited to, microprocessors, charge-coupled devices (CCDs), system on chip (SoC) ICs, or baseband processors, other applications can also include microelectronic machines, MEMS, optical devices, lasers, and the like. Embodiments may also be used to fabricate individual semiconductor devices. For instance, a cobalt contact as described herein may be used to fabricate a conductive contact to various conductive regions of a semiconductor device, such as a gate electrode of a metal oxide semiconductor (MOS) transistor.

As used herein, the singular forms "a," "an" and "the" include plural referents unless the context clearly dictates otherwise. Thus, for example, reference to a "barrier layer" includes examples having two or more such "barrier layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a conductive fill layer that comprises cobalt include embodiments where a conductive fill layer consists essentially of cobalt and embodiments where a conductive fill layer consists of cobalt.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a metal interconnect structure, comprising:
   forming an opening in a dielectric layer disposed over a semiconductor substrate having a conductive region, wherein the opening exposes the conductive region of the substrate;
   forming a titanium layer within the opening and over the conductive region of the substrate;
   forming a silicon layer over the titanium layer;
   forming a cobalt layer over the silicon layer;
   reacting the titanium layer with the conductive region to form a titanium silicide layer;
   reacting the cobalt layer with the silicon layer to form a cobalt silicide layer; and forming a fill layer comprising cobalt within the opening and on a surface of the cobalt silicide layer.

2. The method of claim 1, wherein reacting the titanium layer with the conductive region precedes forming the cobalt layer.

3. The method of claim 1, wherein the silicon layer comprises a dopant.

4. The method of claim 1, wherein forming the silicon layer comprises a conformal deposition process.

5. The method of claim 1, wherein forming the silicon layer comprises a non-conformal deposition process.

6. The method of claim 1, wherein the silicon layer is formed directly over the titanium layer and the cobalt layer is formed directly over the silicon layer.

7. The method of claim 1, further comprising forming the titanium layer over sidewalls of the opening.

8. The method of claim 7, wherein a portion of the cobalt layer is formed over the sidewalls of the opening and directly over the titanium layer.

9. The method of claim 1, wherein the fill layer comprises at least 50 atomic percent cobalt.

10. The method of claim 1, further comprising removing portions of the fill layer disposed above an upper surface of the dielectric layer.

* * * * *